REMOTE CONTROL DEVICE RESPONSIVE TO CONTINUOUS WAVE SIGNALS AND NONRESPONSIVE TO AMPLITUDE MODULATED TYPE SIGNALS
Filed Jan. 19, 1961
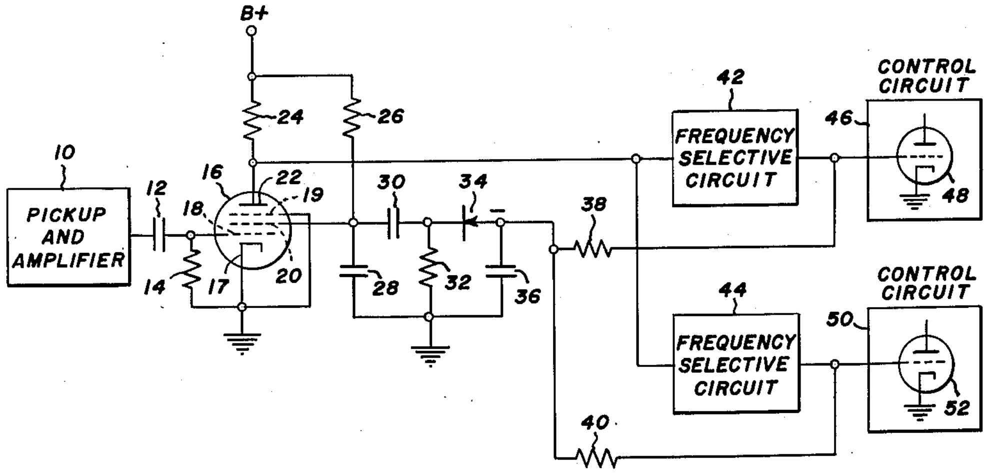
INVENTORS:
WILLIAM E. GOOD,
THOMAS T. TRUE,
BY Joseph Levinson
THEIR ATTORNEY.

United States Patent Office 3,037,170

Patented May 29, 1962

3,037,170

REMOTE CONTROL DEVICE RESPONSIVE TO CONTINUOUS WAVE SIGNALS AND NON-RESPONSIVE TO AMPLITUDE MODULATED TYPE SIGNALS

William E. Good, Liverpool, and Thomas T. True, Camillus, N.Y., assignors to General Electric Company, a corporation of New York Filed Jan. 19, 1961, Ser. No. 83,792
5 Claims. (Cl. 328—150)

This invention relates to remote control systems using unmodulated carriers and more particularly to a noise immunity circuit for such systems.

Remote control systems are utilized for performing various functions. For example, in television receivers they are utilized for channel selection, volume control and turning the receiver on and off. The systems consist of a transmitter for transmitting a plurality of control signals and a receiver which is responsive to these signals which actuates control circuits to perform the various functions.

In sonic remote control systems using unmodulated carriers, ceramic transducers, such as barium titanate, are utilized to pick up the sonic signal from a remote transmitter. These transducers inherently have a restricted bandwidth. Accordingly, noise signals such as are produced by clicking coins, jangling keys, bells, etc. produce damped exponential radio frequency waves at the output of the transducer. The output signal from the transducer is amplified, amplitude limited and then applied to frequency selective circuits to determine the function to be operated. The limiting stage of the receiver smooths out the damped exponential waves appearing at the output of the transducer during noise input intervals thereby producing signals similar to the desired signals which are received from the remote transmitter. Unless extremely selective circuits are used following the limiter stage, spurious operation of the control circuits occurs during the reception of noise signals.

It is an object of this invention to provide a remote control system using unmodulated carrier waves which prevents spurious operation of control circuits by unwanted or noise signals.

A further object of this invention is to provide a single, economical and improved remote control system having noise immunity.

In carrying out this invention in one illustrative embodiment thereof, the difference between the desired signal from the transmitter and the undesired noise signal is utilized to prevent spurious operation by cutting off the receiver during the presence of noise or amplitude modulated signals. This is accomplished by providing a bias voltage whenever amplitude modulation signals are received. This bias voltage is used to cut off stages of the remote receiver thereby preventing spurious operation. The bias voltage is obtained from the output of a limiter stage or non-linear circuit by by-passing it for radio frequency but not for the low frequency audio signals produced by the variation in the limiter output current. This audio voltage is rectified and used as a bias voltage for preventing spurious operation.

These and other objects together with the operation of this invention will be more clearly understood from the following description taken in connection with the accompanying drawing and its scope will be apparent from the appended claims.

The drawing is a schematic diagram of the noise immune remote control system embodied in this invention.

Referring now to the drawing, the receiver of the remote control system consist principally of a pick up and amplifier stage 10, a limiter stage 16, a pair of frequency selective circuits 42 and 44 and a pair of control circuits 46 and 50. The limiter stage 16 has a cathode 17, a control electrode 18, a screen electrode 20, a suppressor electrode 19, and an anode 22. A source of B+ potential is supplied to the anode 22 via a resistor 24 and is also supplied to the screen grid 20 via a resistor 26. A biasing resistor 14 is connected between the control electrode 18 and the cathode 17 with the cathode 17 being connected to ground. The pick up and amplifier stage 10 consists of a sonic transducer and a conventional amplifier which picks up signals from a remote transmitter (not shown) and applies them via a coupling capacitor 12 to the control grid 18 of the limiter stage 16. For this particular remote control system, unmodulated carrier frequencies (CW) waves are utilized. The anode circuit 22 of limiter stage 16 is coupled to the frequency selective circuits 42 and 44. The frequency selective circuits are tuned to different frequencies corresponding to the function which is to be controlled. They may consist of tuned circuits and a detector for applying a control signal to the control circuits 46 and 50 respectively. The control circuits 46 and 50 contain therein an amplifier 48 and an amplifier 52 respectively which are normally non-conducting until a positive signal is received from its respective frequency selective circuit. The amplifier tubes 48 and 52 may actuate relays to close external motor circuits to perform such operations as channel selection, volume control or on-off functions. It will be appreciated that the number of frequency selective and control circuits depends on the number of control functions which are to be performed by the remote control system.

Noise immunity for the aforesaid circuit is provided in the following manner. The basic difference between the desired signal from the transmitter and the undesired noise signal is that the transmitter signal is a steady carrier of fixed frequency and amplitude, whereas the noise signal is randomly varying being modulated both in frequency and amplitude. This fundamental difference is utilized to prevent spurious operation of the remote control system by cutting off the remote receiver during the presence of amplitude modulated signals. To obtain this effect, a bias voltage must be generated whenever amplitude modulated signals are received, and must also be absent during other periods. The bias voltage can then be used to cut off stages of the remote receiver thereby preventing spurious operation.

In accordance with the present invention, the demodulated signal envelope is obtained from the screen grid 20 of the limiter stage 16 by by-passing the screen grid 20 for radio frequencies but not for the low frequency audio signals produced by the variation in limiter screen current. A capacitor 28 is connected between the screen grid 20 and ground. The value of capacitor 28 is set low enough so that any low frequency signals will not be grounded but radio frequency signals will be grounded. The average screen current follows envelope variations present in the radio frequency signal at the screen grid 20 because the control grid 18, cathode 17 and screen grid 20 of the limiter 16 act as a triode grid leak detector. The alternating audio voltage present at the screen grid 20 can be rectified and used as a bias voltage for preventing spurious oscillation. The audio voltage from the screen grid 20 is applied via a capacitor 30 and a resistor 32 to a rectifier 34. The rectifier 34 is poled to provide a negative potential across capacitor 36, which is supplied through resistors 38 and 40 to the control grids of amplifiers 48 and 52 of control circuits 46 and 50, respectively. A smoothing capacitor 36 is coupled between the rectifier 34 and ground.

In operation, if a single frequency amplitude modulated carrier is received, audio voltages result at the screen grid 20 by amplitude detection which are rectified and supplied as a negative bias to prevent operation of the control circuits. No such bias voltage will appear when the desired CW carriers are received.

The bias voltage provided by resistors 38 and 40 can be in addition to other negative bias already in the control circuits to keep these circuits from operating until a positive signal is received. It is only necessary that the bias voltage provided by rectifier 34 be large enough to cut the control circuit off on the receipt of an undesired amplitude modulated wave.

Although the present invention has been illustrated with the use of pentode or tetrode discharge devices, it will be appreciated that any non-linear circuit which is capable of developing an audio envelope at its output from an amplitude modulated wave would be suitable for developing the muting or control signal. For example, a triode or a transistor which is operated by a non-linear portion of its operating characteristic could be utilized.

Although the system of the present invention has been described with reference to sonic transducers of the ceramic type, it will be appreciatel by those skilled in the art that the invention is not limited to sonic type pick ups and may include as well radio frequency receivers in which unmodulated carriers are utilized for purposes of actuating control circuits to perform remote control functions.

Since other modifications varied to fit particular operating requirements and environments will be apparent to those skilled in the art, this invention is not considered limited to the examples chosen for purposes of disclosure and covers all changes and modifications which do not constitute departures from the true spirit and scope of this invention.

What we claim as new and desire to secure by Letters Patent of the United States is:

1. In a remote control system activated by desired unmodulated carrier waves, a limiter stage having at least a cathode, a control electrode, screen electrode and an anode, means for applying signals which include desired unmodulated carrier waves and might include undesired modulated carrier waves to the control electrode of said limiter stage, control means connected to said screen electrode for developing a control voltage only in the presence of said undesired modulated carrier waves, a control circuit, means connecting said anode to said control circuit for activating said control circuit on receipt of one of said desired unmodulated carrier waves, and means connecting said control means to said control circuit for preventing operation of said control circuit when a control voltage is developed due to the reception of an amplitude modulated wave.

2. In a remote control system activated by desired unmodulated carrier waves, a limiter stage having at least a cathode, a control electrode, screen electrode and an anode, means for applying signals which include desired unmodulated carrier waves and might include undesired modulated carrier waves to the control electrode of said limiter stage, means connected to said screen electrode for developing only modulation components from said undesired modulated carrier waves, means connected to said screen electrode for developing a bias voltage from said modulation components, a control circuit, means connecting said anode to said control circuit for activating said control circuit on receipt of one of said desired unmodulated carrier waves, and means connecting said bias voltage to said control circuit for preventing operation of said control circuit when a bias voltage is developed due to the reception of an amplitude modulated wave.

3. In a remote control system activated by desired unmodulated carrier waves, a limiter stage having at least a cathode, a control electrode, screen electrode and an anode, means for applying signals which include desired unmodulated carrier waves and might include undesired modulated carrier waves to the control electrode of said limiter stage, capacitor means connected to said screen electrode for developing modulation components from any undesired modulated carriers on said screen electrodes and by-passing higher frequency carrier waves, rectifying means connected to said screen electrode for developing a bias voltage from any modulation components on said screen electrode, a control circuit, means connecting said anode to said control circuit for activating said control circuit on receipt of one of said desired unmodulated carrier waves, and means connecting said bias voltage to said control circuit for preventing operation of said control circuit when a bias voltage is developed due to the reception of an amplitude modulated wave.

4. A remote control system for performing remote control functions when activated by unmodulated carrier waves, comprising means for picking up and amplifying waves from a remote transmitter, a limiter stage having a cathode, a control grid, a screen grid and an anode, means for applying the amplified waves to said control electrode, means for connecting said cathode to a ground reference potential, means for applying a source of positive potential to said anode and said screen electrode, a plurality of frequency selective circuits connected to said anode which are activated when a predetermined carrier wave is received, a plurality of control circuits connected to said frequency selective circuits which are activated by their respective frequency selective circuits to perform a predetermined remote control function, a capacitor means connected between said screen grid and ground reference potential for developing on said screen grid any modulation components which result from amplitude modulated carrier waves being applied to said limiter stage, rectifier means connected to said screen grid for developing a direct current control voltage from any modulation components appearing thereon, and means for applying said direct current control voltages to said control circuits for preventing the operation of said control circuits when said control voltage is applied thereto.

5. In a remote control system activated by desired unmodulated carrier waves, a limiter stage having an input and an output, means for applying signals which include desired unmodulated carrier waves and might include undesired modulated carrier waves to the input of said limiter stage, control means connected to the output of said limiter stage for developing a control voltage only in the presence of said undesired modulated carrier waves, a control circuit, means connecting the output of said limiter stage to said control circuit for activating said control circuit on receipt of one of said desired unmodulated carrier waves, and means connecting said control means to said control circuit for preventing operation of said control circuit when a control voltage is developed due to the reception of an amplitude modulated wave.

No references cited.